United States Patent
Syzdek et al.

(10) Patent No.: US 7,649,781 B2
(45) Date of Patent: Jan. 19, 2010

(54) BIT CELL REFERENCE DEVICE AND METHODS THEREOF

(75) Inventors: Ronald J. Syzdek, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 54 days.

(21) Appl. No.: 11/435,944

(22) Filed: May 17, 2006

(65) Prior Publication Data

US 2008/0043525 A1    Feb. 21, 2008

(51) Int. Cl.
*G11C 16/06* (2006.01)

(52) U.S. Cl. .............. 365/185.21; 365/185.08; 365/185.2; 365/242; 365/189.09; 365/189.07; 365/185.24

(58) Field of Classification Search ............ 365/185.21, 365/185.8, 185.02, 185.2, 220, 210, 242, 365/189.09, 189.07, 185.22, 185.24; 322/312; 327/538

See application file for complete search history.

(56) References Cited

U.S. PATENT DOCUMENTS

| | | | | |
|---|---|---|---|---|
| 5,163,021 A * | 11/1992 | Mehrotra et al. | ....... | 365/185.03 |
| 5,699,024 A * | 12/1997 | Manlove et al. | ............. | 331/111 |
| 5,751,171 A * | 5/1998 | Ngo | ............................. | 327/110 |
| 5,760,640 A * | 6/1998 | Girard et al. | ................. | 327/543 |
| 5,917,340 A * | 6/1999 | Manohar et al. | .............. | 326/82 |
| 5,999,054 A * | 12/1999 | Suzuki | ........................ | 330/255 |
| 6,426,894 B1 * | 7/2002 | Hirano | ................... | 365/185.18 |
| 6,618,786 B1 * | 9/2003 | Sidiropoulos et al. | ....... | 710/305 |
| 6,754,125 B2 | 6/2004 | Fournel et al. | | |
| 6,785,163 B2 * | 8/2004 | Yeh et al. | .................. | 365/185.2 |
| 7,199,646 B1 * | 4/2007 | Zupcau et al. | ............... | 327/539 |
| 7,283,384 B1 * | 10/2007 | Jenne et al. | .................. | 365/158 |
| 2001/0024381 A1 * | 9/2001 | Fuchigami et al. | ..... | 365/185.21 |
| 2002/0118576 A1 * | 8/2002 | Ohba et al. | ............ | 365/189.07 |

* cited by examiner

*Primary Examiner*—Hoai V Ho
*Assistant Examiner*—Fernando N Hidalgo

(57) ABSTRACT

A memory device is disclosed. A reference device of the memory includes a trimmable current source and a fixed current source. Currents provided by each source are summed to provide a reference current to a sense amplifier. The sense amplifier senses the state of a bit cell by comparing a current from the bit cell, representative of a logic value, to the reference current. By basing the reference current on both a fixed and a trimmable current source, the reference device can be trimmed to compensate for process and operating characteristics of the device, while maintaining a minimum reference current in the event of a disturb mechanism that results in loss of the current provided by the trimmable current source.

20 Claims, 4 Drawing Sheets

US 7,649,781 B2

BIT CELL REFERENCE DEVICE AND METHODS THEREOF

FIELD OF THE DISCLOSURE

The present disclosure relates to bit cell sensing devices.

BACKGROUND

Many integrated circuit devices employ memory devices to store data. The memory devices are typically composed of bit cells, with each bit cell storing a bit of data. In order to read the value of data stored at a bit cell, a signal generated by the bit cell in response to a read voltage is compared at a sense amplifier to a reference signal provided by a reference device. The signal from the bit cell is generated by applying the read voltage to a gate electrode of a bit cell transistor to generate a current that represents a logic state. However, the signal level from the bit cell associated with a particular logic state can vary based on operating and process characteristics of the integrated circuit device. For example, the signal level associated with a high logic state can change based on the temperature or other operating characteristic of the integrated circuit device. Accordingly, it is sometimes desirable to design the reference device so that the reference signal tracks the operating characteristics of the associated bit cell with respect to temperature and voltage. For example, the reference device can include a transistor having similar characteristics as the bit cell transistor, allowing it to track the bit cell transistor. In addition, the reference device can be trimmed after formation of the integrated circuit device to ensure that the reference signal is at an appropriate level. By using a trimmable reference device that tracks the operating characteristics of the associated bit cell, the sense amplifier is able to appropriately read the state of the bit cell over a wider range of operating parameters.

The reference device may, however, be subject to disturb mechanisms that can adversely affect the reference signal level in response to a read voltage. For example, a floating gate bit cell is sometimes used as a reference device. In some cases, a disturb mechanism can cause the floating gate bit cell to program or clear, leading to an undesirable shift in its voltage threshold and leading to errors in reading memory bit cells. Accordingly, an improved device for providing a bit cell reference would be advantageous.

DETAILED DESCRIPTION

A memory device is disclosed. A reference device of the memory includes a trimmable current source and a fixed current source. Currents provided by each source are summed to provide a reference current to a sense amplifier. The sense amplifier senses the state of a bit cell by comparing a current from the bit cell, representative of a logic value, to the reference current. By basing the reference current on both a fixed and a trimmable current source, the reference device can be trimmed to compensate for process and operating characteristics of the device, while maintaining a minimum reference current in the event of a disturb mechanism that results in loss of the current provided by the trimmable current source.

Figure 1:
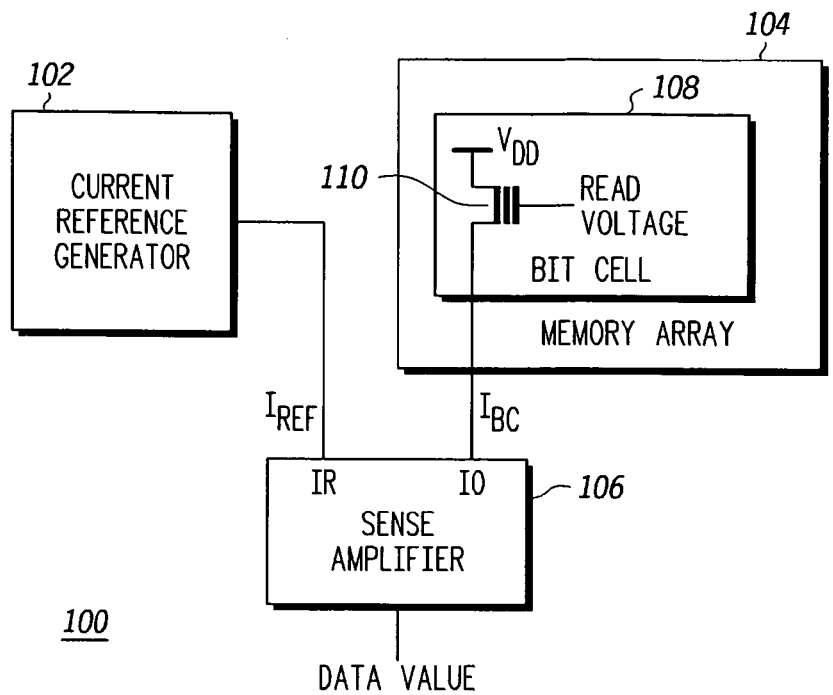
FIG. 1 is a block diagram of a particular embodiment of a memory device.

Referring to FIG. 1, a particular embodiment of a memory device 100 is illustrated. The memory device 100 includes a current reference generator 102, a memory array 104, and a sense amplifier 106. The current reference generator 102 includes an output to provide a current IREF. The memory array 104 includes an output to provide a current IBC. The sense amplifier 106 includes an input IR connected to the output of the current reference generator, an input ID connected to the memory array 104, and an output to provide a signal DATA VALUE.

During operation, the current reference generator 102 provides the current IREF. The current IREF can be trimmed to a desired value that substantially tracks changes in the bit cells of the memory array 104, but remains relatively insensitive to disturb mechanisms. In one embodiment, a disturb mechanism is an event or condition that causes a bit cell of the current reference generator to program or erase.

In a particular embodiment, the current reference generator 102 is trimmable, so that the current IREF can be adjusted to compensate for changes in the current IBC due to changes in operating characteristics of the memory array 104. However, the current reference generator 102 maintains a minimum level for the current IREF to provide reliability in the presence of disturb mechanisms.

The memory array 104 includes a bit cell 108 that provides the current IBC. The bit cell 108 includes a floating gate transistor 110 having a current electrode connected to reference VDD, a current electrode to provide the current IBC, and a gate electrode to receive a read voltage. When the read voltage is applied, the level of the current IBC depends on the programmed level of the floating gate transistor 110. At the same time, the current reference generator 102 maintains the current IREF at a level between expected levels of the current IBC provided by the memory array 104. For example, in a particular embodiment the memory array 104 provides a current IBC of less than 4 microamps to represent a stored logic level of "0", and a current IBC of more than 10 microamps to represent a logic level of "1." Accordingly, the current reference generator can be configured to provide the current IREF at a level, such as 8 microamps, between the expected current levels of the current IBC.

The sense amplifier 106 compares the current IREF and the current IBC and provides the signal DATA VALUE based on the comparison. Because the current IREF is maintained at a level between the expected levels of the current IBC, the signal DATA VALUE can represent a logic level of the data stored in the bit cell 108.

Figure 2:
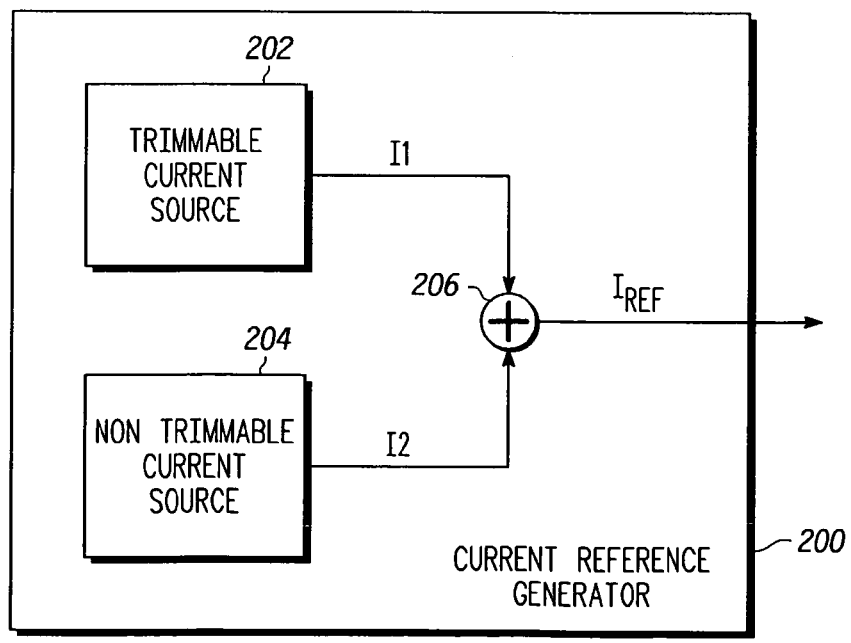
FIG. 2 is a block diagram of a particular embodiment of the current reference generator of FIG. 1.

Referring to FIG. 2, a particular embodiment of a current reference generator 200 is illustrated. The current reference generator 200 may be used in place of the current reference generator 102 of FIG. 1. The current reference generator 200 includes a trimmable current source 102, a non-trimmable current source 204, and a current summer 206. The trimmable current source 202 includes an output to provide a current I1. The non-trimmable current source 204 includes an output to provide a current I2. The summer 206 includes an input connected to the output of the trimmable current source 202, an input connected to the output of the non-trimmable current source 204, and an output to provide the current IREF.

During operation, the trimmable current source 202 has similar operating characteristics as the bit cells of a memory array, such as the bit cell 108 of the memory array 104, to provide a current that tracks changes in the current IBC from the bit cells, while the non-trimmable current source 204 provides a current that is relatively insensitive to the operating characteristics, such as temperature, voltage, and process characteristics. Accordingly, the current reference generator 200 provides a current IREF that includes a first portion of current that varies based upon changes in the operating characteristics of the memory array, and a second portion that remains relatively fixed. Thus, in normal operation, the current reference generator 200 maintains a current that substantially tracks a bit cell current across a range of operating conditions.

As discussed, the trimmable current source 202 provides a current that is similarly sensitive to changes in operating and process characteristics as the bit cells of the memory array. For example, the trimmable current source 202 can be composed of similar components as the bit cells of the memory array, and can be placed relatively close to the bit cell in an integrated circuit so that the trimmable current source 202 and the bit cells are likely to experience similar operating and process characteristics. Thus, changes in the signal level provided by a bit cell resulting from changes in process and operating characteristics can result in a commensurate change in the level of the current I1.

In addition, the trimmable current source 202 can be trimmed to change the level of the current I1 to further adjust for changes in the operating and process characteristics of the trimmable current source 202. Accordingly, the trimmable current source 202 may be trimmed to adjust the current I1 (and thereby adjust the output of the summer 206) so that the level of the current IREF is set to a desired level.

In contrast to the trimmable current source 202, the non-trimmable current source 204 is relatively insensitive to changes in process and operating characteristics that affect the bit cells of the memory array. In addition, the non-trimmable current source 204 is insensitive to disturb mechanisms that can affect the trimmable current source 202. Accordingly, the non-trimmable current source 204 provides a current I2 that stays at a substantially fixed level as compared to the current I1. By providing a fixed current I2, the current IREF is prevented from falling below a desired level set by the current I2. Accordingly, in the event that the trimmable current source 202 experiences a disturb event, resulting in a very low current I1, the current IREF is maintained at a minimum level.

The summer 206 sums the current I1 and the current I2 to provide the current IREF. Accordingly, the current reference generator 200 provides a reliable level of the current IREF even when subject to disturb mechanisms, but remains sensitive to changes in operating characteristics of the memory array.

Figure 3:
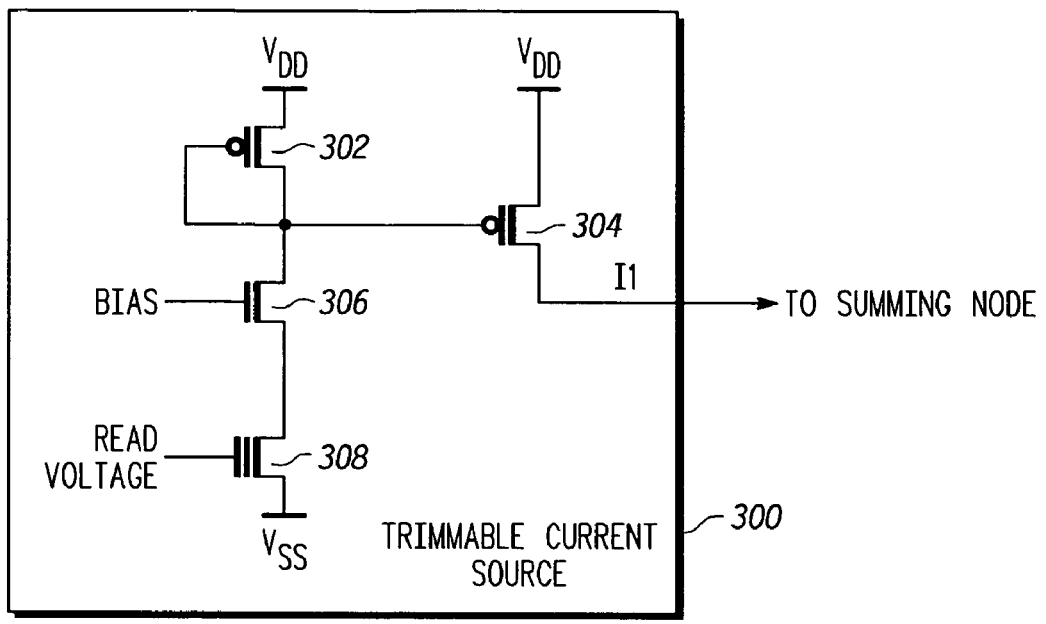
FIG. 3 is a block diagram of a particular embodiment of the trimmable current source of FIG. 2.

Referring to FIG. 3, a particular embodiment of a trimmable current source 300 is illustrated. The trimmable current source 300 may be used in place of the trimmable current source 202 of FIG. 2. The trimmable current source 300 includes p-type transistors 302 and 304, an n-type transistor 306, and an n-type floating gate transistor 308. The transistor 302 includes a first current electrode connected to a reference VDD, a second current electrode, and a gate electrode connected to the second current electrode. The transistor 304 includes a first current electrode connected to the reference VDD, a second current electrode to provide the current I1, and a gate electrode connected to the second current electrode of the transistor 302. The transistor 306 includes a first current electrode connected to the second current electrode of the transistor 302, a second current electrode, and a gate electrode to receive a signal BIAS. The floating gate transistor 308 includes a first current electrode connected to the second current electrode of the transistor 306, and a gate electrode to receive a read voltage.

During operation, the trimmable current source 300 provides the current I1 to a summer. The current I1 tracks changes in a signal provided by a bit cell of a memory array by having matched operating and process characteristics with the bit cell. The current I1 can be combined at the summer with a current that is relatively insensitive to the operating and process characteristics to provide a reference current including a current portion that is sensitive to the operating and processing characteristics of the bit cell, and including another current portion that is insensitive to disturb mechanisms experienced by the trimmable current source 300.

Upon application of the read voltage, the combination of the floating gate transistor 308 and the transistors 302, 304, 306, and 308 provide the current I1 to the summer. The transistors 302 and 304 are configured as a current mirror so that the current provided by the transistors 306 and 308 is provided as the current I1. In a particular embodiment, the floating gate transistor 308 is manufactured using the same process as the floating gate transistors of the bit cells of the memory array, so that changes to the signal level provided by the bit cell due to process and operating characteristics of the bit cell will be matched by similar changes in level of the current I1. The BIAS signal can be used in a programming operation to trim the floating gate transistor 308 to change the level of the current I1, and thereby provide a desired IREF at the time of trimming.

Figure 4:
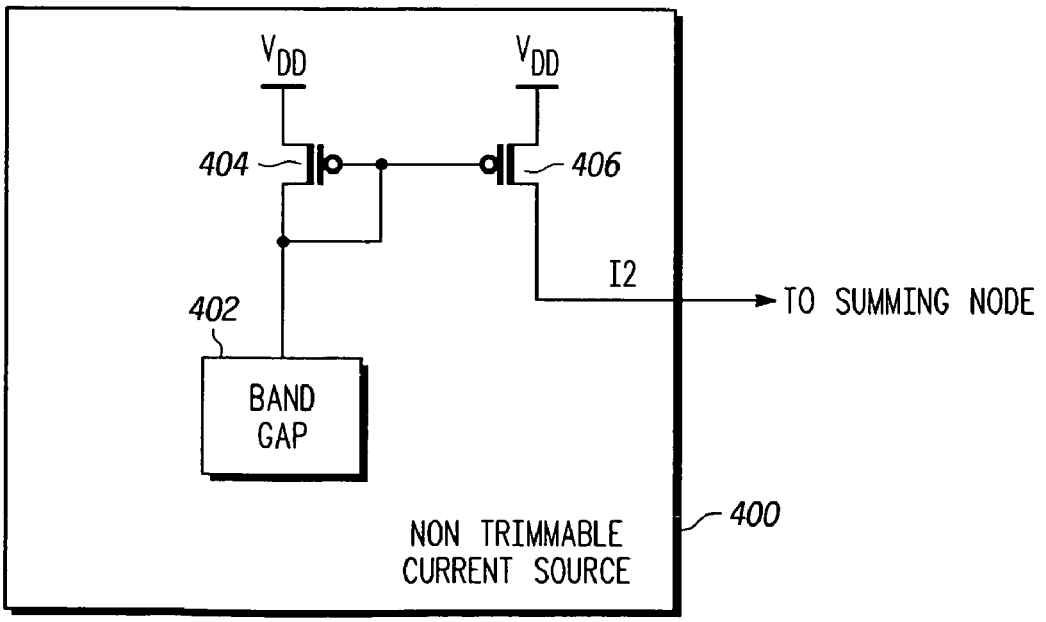
FIG. 4 is a block diagram of a particular embodiment of the nontrimmable current source of FIG. 2.

Referring to FIG. 4, a particular embodiment of non-trimmable current source 400 is illustrated. The non-trimmable current source 400 is one embodiment of the non-trimmable current source 204 of FIG. 2. The non-trimmable current source 400 includes a band gap reference module 402 and p-type transistors 404 and 406. The band gap reference module 402 includes an output to provide a current I2. The transistor 404 includes a first current electrode connected to a reference VDD, a second current electrode connected to the output of the band gap reference module 402, and a gate electrode connected to the second current electrode. The transistor 406 includes a first current electrode connected to the reference VDD, a second current electrode to provide a current I2, and a gate electrode connected to the gate electrode of the transistor 404.

During operation, the combination of the band gap reference module 402, the transistor 404, and the transistor 406 provide a relatively fixed current I2. The current I2 is relatively insensitive to the process and operating characteristics of a bit cell (not shown) associated with the non-trimmable current source. Accordingly, the current I2 is insensitive to disturb mechanisms that may affect the bit cell or other current sources. The current I2 is provided to a summer, where it is combined with a current that is sensitive to the process and operating characteristics of the bit cell. The summer thus is able to provide a reference current that is sensitive to the operating and processing characteristics of the bit cell, but insensitive to disturb mechanisms.

Figure 5:
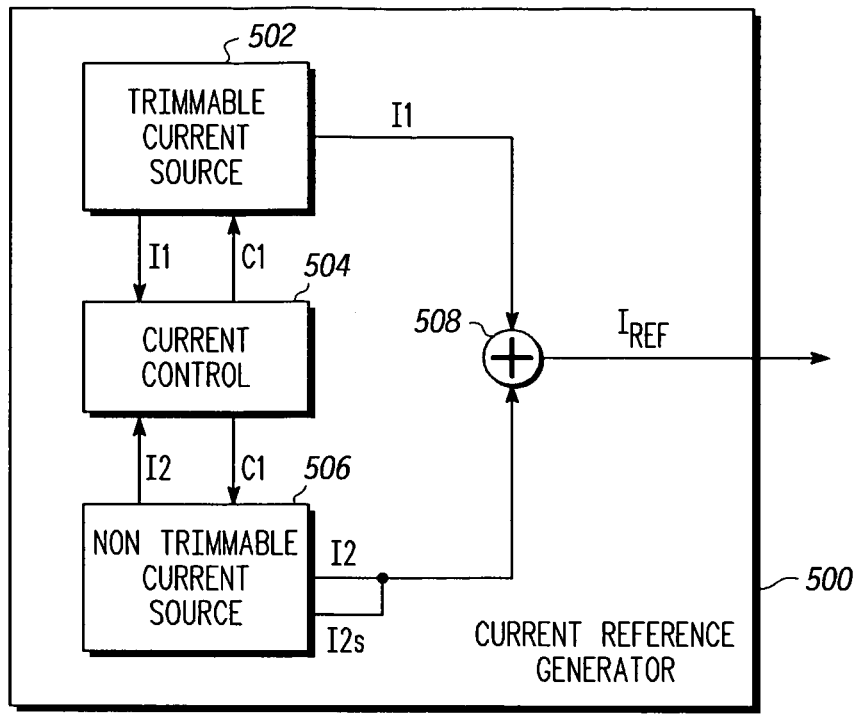
FIG. 5 is a block diagram of an alternative embodiment of the current reference generator of FIG. 1.

Referring to FIG. 5, a particular embodiment of a current reference generator 500 is illustrated. The current reference generator 500 is a particular embodiment of the current reference generator 102 of FIG. 1. The current reference generator 500 includes a trimmable current source 502, a current control module 504, a non-trimmable current source 506, and a summer 508. The trimmable current source 502 includes a first output to provide a current I1, a second output to also provide a second current I1, and a control input. The non-trimmable current source 506 includes a first output to provide a current I2, a second output to also provide the current I2, a third output to provide a current I2S, and a control input. The current control module 504 includes a first input connected to the first output of the trimmable current source 502, a second input connected to the first output of the non-trimmable current source 506, a first control output connected to the control input of the trimmable current source 502 to provide a control signal C1, and a second control output connected to the control input of the non-trimmable current source 506 to provide the control signal C1. The summer 508 includes a first input connected to the second output of the trimmable current source 502, a second input connected to the second output of the non-trimmable current source 506, and an output to provide the current IREF.

During operation, the trimmable current source 502 provides a current I1 that tracks changes in the operating characteristics of a bit cell of a memory array, while the non-trimmable current source 506 provides a current I2 that is relatively insensitive to the operating characteristics. In addition, the current control module 504 monitors the levels of the current I1 and the current I2, and controls the current levels so that the current IREF is maintained within a desired range.

If the current I1 falls outside of a desirable range, indicating the trimmable current source 502 has experienced a disturb mechanism, the current control module 504 can assert the control signal C1. For example, the current control module can assert the control signal C1 if the level of the current I1 is above a maximum threshold or below a minimum threshold. In response to assertion of the control signal C1, the trimmable current source 502 reduces the current I1 to a minimal level. In addition, in response to assertion of the control signal C1, the nontrimmable current source 506 increases the level of the current I2S so that the current IREF is maintained within a desired range. In a particular embodiment the control signal C1 is asserted when the level of the current I1 is less than half of the level of the current I2, or when the level of the current I1 is more than twice the level of the current I2. Accordingly, the current IREF is maintained within a desired range in response to a disturb mechanism in the trimmable current source 502.

When I1 is within the desired range, the control signal C1 is deasserted. In response, the nontrimmable current source reduces the level of the current I2S so that the current IREF is maintained within the desired range.

For example, in a particular embodiment the current I2 is provided at a relatively fixed level of 4 microamps while the current I2S is provided at nominal level of 0 microamps. During normal operation, the current I1 is provided at a level of approximately 4 microamps, and this current level varies according to changes in the operating characteristics of the bit cells of the memory array. In addition, the current level of I1 may be trimmed to maintain IREF within a desired range. Accordingly, during normal operation, the current IREF is at a level of approximately 8 microamps, but this level can vary according to variations in the level of the current I1.

In the event of a disturb mechanism or other error condition, the level of the current I1 increases or decreases so that the current IREF will fall outside of a desirable range. Accordingly, in response to the disturb mechanism, the level of the current I1 is reduced by the current control module 504 to a level of approximately 0 microamps. Thus, the current IREF will be fixed at the level of the current I2, or approximately 4 microamps. In some applications, this level of IREF will fall within the desired range. In other applications, the level of the current I2S can be increased, so that the level of the current IREF is maintained at a fixed level of approximately 8 microamps.

Figure 6:
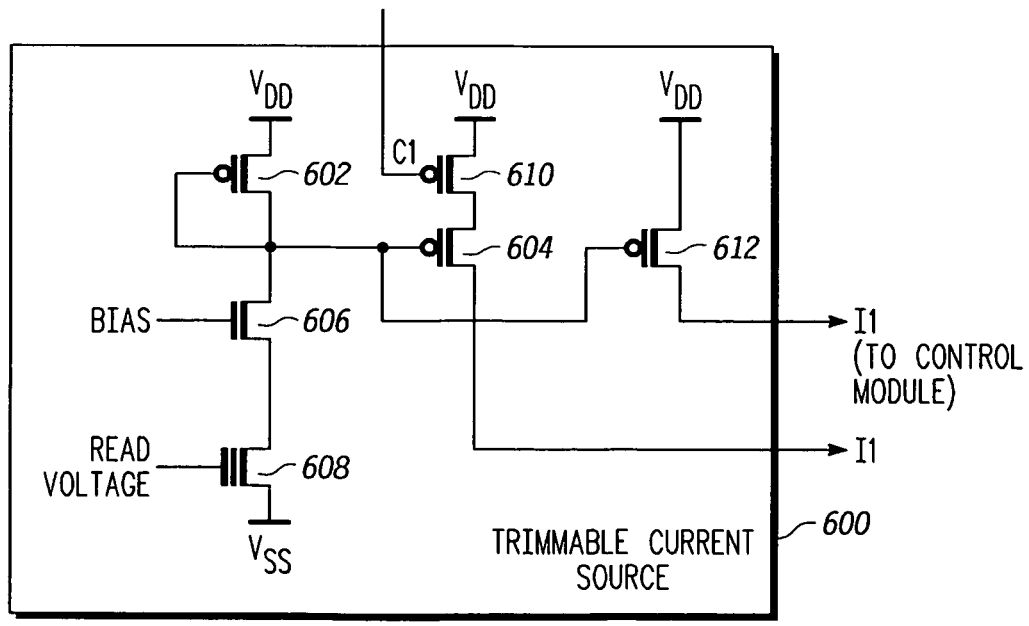
FIG. 6. is a block diagram of a particular embodiment of the trimmable current source of FIG. 5.

Referring to FIG. 6, a particular embodiment of a trimmable current source 600 is illustrated. The trimmable current source 600 may be used in place of the trimmable current source 502 of FIG. 5. The trimmable current source 600 includes p-type transistors 602, 604, 610 and 612, n-type transistor 606, and n-type floating gate transistor 608. The transistor 602 includes a first current electrode connected to a reference VDD, a second current electrode, and a gate electrode connected to the second current electrode. The transistor 604 includes a first current electrode, a second current electrode to provide a current I1, and a gate electrode connected to the second current electrode of the transistor 602. The transistor 606 includes a first current electrode connected to the second current electrode of the transistor 602, a second current electrode connected to a reference VSS, and a gate electrode to receive a signal BIAS. The transistor 610 includes a first current electrode connected to the reference VDD, a second current electrode connected to the first current electrode of the transistor 604, and a gate electrode to receive a control signal C1. The transistor 612 includes a first current electrode connected to the reference VDD, a second current electrode to provide the current I1C, and a gate electrode connected to the second current electrode of the transistor 602.

During operation, upon application of a read voltage the trimmable current source 600 provides the current I1 to a summer. The current I1 tracks changes in a signal provided by a bit cell of a memory array due to the operating and process characteristics of the bit cell. If the current I1C falls outside of a desired range because the trimmable current source 600 experiences a disturb mechanism or other error, the signal C1 is asserted at a logic high by the current control module, and the current I1 is set to a minimal level. This prevents the current I1 from contributing to the current IREF when the trimmable current source 600 experiences a disturb mechanism.

The transistors 602, 604, and 606, as well as the floating gate transistor 608, operate to provide the current I1. The transistor 610 is used to control the flow of the current I1 to the summer. In particular, when the control signal C1 is asserted, indicating that the current I1 has fallen outside of a nominal range, the transistor 610 enters a non-conductive state, and the current I1 provided to the summer is reduced to a minimal level.

Figure 7:
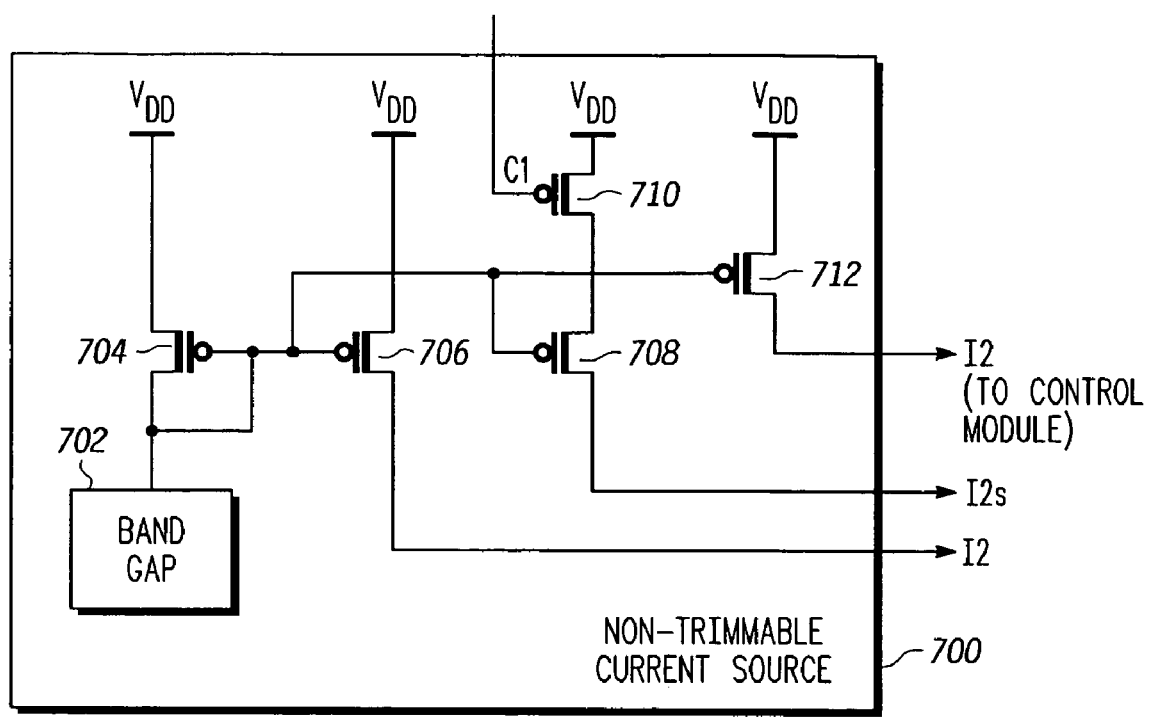
FIG. 7 is a block diagram of a particular embodiment of the nontrimmable current source of FIG. 5.

Referring to FIG. 7, a particular embodiment of a non-trimmable current source 700 is illustrated. The non-trimmable current source 700 includes a band gap reference module 702, p-type transistors 704, 706, 708, and 712, and n-type transistor 710. The band gap reference module 702 includes an output to provide a current. The transistor 704 includes a first current electrode connected to a reference VDD, a second current electrode connected to the output of the band gap 702, and a gate electrode connected to the second current electrode. The transistor 706 includes a first current electrode connected to the reference VDD, a second current electrode to provide a current I2, and a gate electrode connected to the second current electrode of the transistor 704. The transistor 708 includes a first current electrode, a second current electrode to provide a current I2S, and a gate electrode connected to the second current electrode of the transistor 704. The transistor 710 includes a first current electrode connected to the reference VDD, a second current electrode connected to the first current electrode of the transistor 708, and a gate electrode to receive a control signal C1. The transistor 712 includes a first current electrode connected to the reference VDD, a second current electrode to provide a current I2C, and a gate electrode connected to the second current electrode of the transistor 704.

During operation, the current I2 is relatively insensitive to the process and operating characteristics of a bit cell (not shown) associated with the non-trimmable current source 700. Accordingly, the current I2 is insensitive to disturb mechanisms that may affect the bit cell or other current sources. The current I2 is provided to the summer, where it is combined with a current from a second current source (not shown) that is sensitive to the process and operating characteristics of the bit cell to provide a reference current.

In addition, the current I2S can be provided to the current control module for monitoring. If the current from the second current source is maintained within a desired range, the control signal C1 is deasserted at a logic low, and the level of the current I2S is set to a minimal level. If the current from the second current source falls outside of a desired range because of a disturb mechanism or other error, the current control module can assert the control signal C1 at a logic high, thereby increasing the current I2S to maintain the reference current. Accordingly, the reference current is maintained within a desired range even if one of the current sources experiences disturb mechanisms or other errors.

The combination of the band gap reference module 702, the transistor 704, and the transistor 706 provide a relatively fixed current I2. When the control signal C1 is deasserted, indicating that the current level 12 should be a low level, the transistor 710 is placed in a non-conductive state, and the current I2S is set to a minimal level When the control signal C1 is asserted, the transistor 710 is placed in a conductive state, and the current I2S is set to maintain the reference current. Accordingly, the current I2 can be set to a desired level, depending on whether the current provided by a second, trimmable current source, is within a desirable range.

A method for providing a reference current is disclosed. In a particular embodiment, the method includes receiving a first current from a trimmable current source, receiving a second current from a non-trimmable current source, and providing a third current based on the first current and the second current to provide a reference current to read a first non-volatile bit cell. In a particular aspect, the trimmable current source is a second non-volatile bit cell. In another particular aspect, the trimmable current source is a floating gate bit cell.

In another particular aspect, the method includes increasing the second current responsive to the first current being below a threshold. In still another particular aspect, the method includes increasing the second current responsive to the first current being above a threshold.

In a particular aspect, the method includes reducing the first current responsive to the first current being above a threshold. In another particular aspect the trimmable current source is associated with a plurality of data bit cells, and the first current is based on a threshold voltage associated with the plurality of data bit cells. In yet another particular aspect, the reference current is approximately 8 microamps.

A device for providing a reference current is disclosed. In a particular embodiment, the device includes a trimmable current source having an output to provide a trimmed current, a non-trimmable current source having an output to provide an untrimmed current and a summing module. The summing module includes a first input coupled to the output of the trimmable current source, a second input coupled to the output of the non-trimmable current source, a summer coupled to the first input and the second input, and an output to provide a reference current based on a current at the summer.

In a particular aspect the trimmable current source includes a non-volatile bit cell. In another particular aspect, the trimmable current source includes a floating gate transistor having a first current electrode and a second current electrode and a first transistor having a first current electrode coupled to the first current electrode of the floating gate transistor, a second current electrode, and a gate electrode to receive a trimmed bias signal. In still another particular aspect, the trimmable current source further includes a current mirror coupled to the second current electrode of the first transistor. In another particular aspect the trimmable current source further includes a second transistor having a first current electrode coupled to a reference voltage, a second current electrode, and a gate electrode coupled to the current mirror.

In a particular aspect the non-trimmable current source includes a band gap current source. In another particular aspect the device includes a current comparison module comprising an input coupled to the output of the trimmable current source, and an output to provide a control signal, and the non-trimmable current source further includes an input coupled to the output of the current comparison module, and a level of the untrimmed current is based on the control signal.

In a particular aspect, the non-trimmable current source includes a band gap reference module comprising an output, and a first transistor having a first current electrode coupled to the output of the band gap reference module, a second current electrode coupled to the summer, and a gate electrode coupled to the first current electrode. In another particular aspect, the non-trimmable current source further includes a second transistor having a first current electrode coupled to a reference voltage, a second current electrode, and a gate electrode coupled to the gate electrode of the first transistor.

In a particular aspect, the non-trimmable current source further includes a third transistor having a first current electrode coupled to the reference voltage, a second current electrode coupled to the summer, and a gate electrode to receive the control signal. In another particular aspect a level of the trimmed current is based on the control signal. In still another particular aspect, the device includes a sense amplifier comprising an input coupled to the output of the summing module.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A device, comprising:
   a trimmable current source comprising an output to provide a trimmed current, the trimmed current sensitive to changes in operating and process characteristics similar to a current of a bit cell of a memory array of the device;
   a non-trimmable current source comprising an output to provide an untrimmed current substantially insensitive to the changes in operating and process characteristics;
   a summing module comprising:
   a first input coupled to the output of the trimmable current source;
   a second input coupled to the output of the non-trimmable current source;
   a summer coupled to the first input and the second input; and an output to provide a reference current based on a current at the summer; and a current comparison module comprising an input coupled to the output of the trimmable current source, and an output to provide a control signal based on a comparison of the trimmed current to a threshold;

wherein the non-trimmable current source further comprises an input coupled to the output of the current comparison module, and wherein a level of the untrimmed current is based on the control signal.

2. The device of claim 1, wherein the trimmable current source comprises a non-volatile bit cell.

3. The device of claim 1, wherein the trimmable current source comprises a floating gate transistor having a first current electrode and a second current electrode and a first transistor having a first current electrode coupled to the first current electrode of the floating gate transistor, a second current electrode, and a gate electrode to receive a trimmed bias signal.

4. The device of claim 1, wherein the non-trimmable current source comprises a band gap current source.

5. The device of claim 1, wherein the non-trimmable current source comprises:

a band gap reference module comprising an output, and a first transistor having a first current electrode coupled to the output of the band gap reference module, a second current electrode coupled to a voltage reference, and a gate electrode coupled to the first current electrode.

6. The device of claim 5, wherein the non-trimmable current source further comprises a second transistor having a first current electrode coupled to a reference voltage, a second current electrode coupled to the summer, and a gate electrode coupled to the gate electrode of the first transistor.

7. The device of claim 6, wherein the non-trimmable current source further comprises a third transistor having a first current electrode coupled to the reference voltage, a second current electrode coupled to the summer, and a gate electrode to receive the control signal.

8. The device of claim 7, wherein a level of the trimmed current is based on the control signal.

9. The device of claim 1, further comprising:

a sense amplifier comprising an input coupled to the output of the summing module.

10. A method, comprising:

receiving a first current from a trimmable current source that tracks a current of a first non-volatile bit cell;

receiving a second current from a non-trimmable current source that does not track the current of the first non-volatile bit cell;

providing a third current based on the first current and the second current to provide a reference current to read the first non-volatile bit cell; and adjusting the second current based on a relationship between the first current and a threshold.

11. The method of claim 10, wherein adjusting the second current comprises increasing the second current responsive to the first current being above the threshold.

12. The method of claim 11, wherein the threshold is a minimum threshold, and further comprising decreasing the second current responsive to the first current being above a maximum threshold.

13. The method of claim 10, wherein adjusting the second current comprises increasing the second current responsive to the first current being below the threshold.

14. The method of claim 10, wherein adjusting the second current comprises decreasing the second current responsive to the first current being above the threshold.

15. The method of claim 10, wherein adjusting the second current comprises decreasing the second current responsive to the first current being below the threshold.

16. The method of claim 10, wherein the trimmable current source comprises a second non-volatile bit cell.

17. In a memory, a method comprising:

receiving a first current from a trimmable current source, the first current sensitive to changes in operating and process characteristics that affect a first non-volatile bit cell of the memory;

receiving a second current from a non-trimmable current source, the second current relatively insensitive to the changes in the operating and process characteristics;

providing a third current based on the first current and the second current to provide a reference current to read the first non-volatile bit cell; and adjusting the second current based on a relationship between the first current and a threshold.

18. The method of claim 17, wherein adjusting the second current comprises:

increasing the second current responsive to the first current being below the threshold; and decreasing the second current responsive to the first current being above the threshold.

19. The method of claim 17, wherein adjusting the second current comprises:

decreasing the second current responsive to the first current being below the threshold; and increasing the second current responsive to the first current being above the threshold.

20. The method of claim 17, wherein the trimmable current source comprises a second non-volatile bit cell.

* * * * *